United States Patent
Wuidart et al.

(10) Patent No.: US 7,110,277 B2
(45) Date of Patent: Sep. 19, 2006

(54) MEMORY CELL WITH NON-DESTRUCTIVE ONE-TIME PROGRAMMING

(75) Inventors: Luc Wuidart, Pourrieres (FR); Michel Bardouillet, Rousset (FR); Alexandre Malherbe, Trets (FR)

(73) Assignee: STMicroelectronics S.A., Montrouge (FR)

( * ) Notice: Subject to any disclaimer, the term of this patent is extended or adjusted under 35 U.S.C. 154(b) by 34 days.

(21) Appl. No.: 10/504,273

(22) PCT Filed: Feb. 11, 2003

(86) PCT No.: PCT/FR03/00446

§ 371 (c)(1),
(2), (4) Date: Jan. 27, 2005

(87) PCT Pub. No.: WO03/069630

PCT Pub. Date: Aug. 21, 2003

(65) Prior Publication Data

US 2005/0122759 A1    Jun. 9, 2005

(30) Foreign Application Priority Data

Feb. 11, 2002  (FR) .................. 02 01637
Oct. 29, 2002  (FR) .................. 02 13555

(51) Int. Cl.
*G11C 17/00*    (2006.01)

(52) U.S. Cl. ................................ 365/100; 365/148
(58) Field of Classification Search ............ 365/100, 365/148
See application file for complete search history.

(56) References Cited

U.S. PATENT DOCUMENTS 3,863,231 A    1/1975  Taylor (Continued)

FOREIGN PATENT DOCUMENTS

FR    2 523 357    9/1983

(Continued)

OTHER PUBLICATIONS

International Search Report from co-pending PCT application No. PCT/FR03/00446, filed Feb. 11, 2003.

(Continued)

*Primary Examiner*—Tuan T. Nguyen
(74) *Attorney, Agent, or Firm*—Lisa K. Jorgenson; James H. Morris; Wolf, Greenfield & Sacks, P.C.

(57) ABSTRACT

A one-time programmable memory cell and the programming thereof including a programming transistor which is disposed in series with a polycrystalline silicon programming resistor forming the memory element. The programming is non-destructive with respect to the polycrystalline silicon resistor.

23 Claims, 3 Drawing Sheets

U.S. PATENT DOCUMENTS

| | | |
|---|---|---|
| 4,132,904 A | 1/1979 | Harari |
| 4,146,902 A | 3/1979 | Tanimoto et al. |
| 4,175,290 A | 11/1979 | Harari |
| 4,342,102 A | 7/1982 | Puar |
| 4,399,372 A | 8/1983 | Tanimoto et al. |
| 4,404,581 A | 9/1983 | Tam et al. |
| 4,449,203 A | 5/1984 | Adlhoch |
| 4,476,478 A | 10/1984 | Noguchi et al. |
| 4,503,518 A | 3/1985 | Iwahasih |
| 4,565,712 A | 1/1986 | Noguchi et al. |
| 5,334,880 A | 8/1994 | Abadeer et al. |
| 5,418,738 A | 5/1995 | Abadeer et al. |
| 5,504,760 A | 4/1996 | Harari et al. |
| 5,606,523 A | 2/1997 | Mirabel |
| 5,689,455 A | 11/1997 | Mullarkey et al. |
| 5,761,118 A | 6/1998 | Chai |
| 5,784,314 A | 7/1998 | Sali et al. |
| 5,926,409 A | 7/1999 | Engh et al. |
| 5,936,880 A | 8/1999 | Payne |
| 6,191,989 B1 | 2/2001 | Luk et al. |
| 6,198,678 B1 | 3/2001 | Albon et al. |
| 7,002,829 B1 * | 2/2006 | Singh et al. .................. 365/96 |
| 7,009,891 B1 * | 3/2006 | Chen et al. ............ 365/189.01 |
| 2002/0074616 A1 * | 6/2002 | Chen et al. .................. 257/516 |
| 2006/0056222 A1 * | 3/2006 | Reiner ........................ 365/104 |

FOREIGN PATENT DOCUMENTS

JP        54 098536        8/1979

OTHER PUBLICATIONS

International Search Report from PCT application No. PCT/FR03/00447, filed Feb. 11, 2003.

* cited by examiner

MEMORY CELL WITH NON-DESTRUCTIVE ONE-TIME PROGRAMMING

BACKGROUND OF THE INVENTION

1. Field of the Invention

The present invention relates to the field of one-time programming memory cells (OTP) and more specifically to the forming of a one-time programming memory in an integrated circuit.

2. Discussion of the Related Art

Conventionally, integrated circuit one-time programming memories are of EPROM type and thus require specific programming circuits which are not compatible with standard technologies of manufacturing of the MOS transistors used in integrated circuits. There also are one-time programming memories formed by EEPROMs and non-erasable flash memories.

Another category of one-time programming memories is formed of fuse or anti-fuse memories. Such memories include memories formed of a polysilicon bar or track which is submitted to a very high current to physically deteriorate the polysilicon and open the circuit. Such one-time programming memory cells require very high currents (on the order of one hundred milliamperes). This considerably limits their use. Further, the programming performed on a fuse-type cell is optically visible, which is detrimental to the security of a binary code embedded in an integrated circuit and masked in a one-time programming memory.

A similar disadvantage exists with memories of EPROM or EEPROM type, that is, a detection of the state of the storage cells is possible by means of an electronic scanning microscope which can detect the difference of accumulated charges in the floating gate transistors of such memories.

The present invention aims at providing a novel one-time programming memory structure which overcomes the disadvantages of known structures.

The present invention more specifically aims at providing the forming of an integrated circuit memory cell which requires no additional manufacturing step with respect to the steps implemented to manufacture MOS transistors in conventional technologies.

The present invention also aims at improving the security of an embedded code by means of a one-time programming memory cell.

The present invention also aims at providing a low-cost memory cell.

The present invention also aims at providing a one-time programming memory cell.

SUMMARY OF THE INVENTION

To achieve these and other objects, the present invention provides a one-time programming memory cell, comprising a transistor in series with a polysilicon resistor forming the storage element, the programming being controlled by forcing the flowing of a current in the polysilicon resistor which is greater than the current for which the value of this resistance is maximum, the programming being non-destructive for the polysilicon resistor.

According to an embodiment of the present invention, an unprogrammed state is, by programming, modified by decreasing in an irreversible and stable manner in the read operating current range of the cell, the value of the programming polysilicon resistor.

According to an embodiment of the present invention, a resistive read element is connected in parallel with said transistor.

According to an embodiment of the present invention, a resistive read element is connected in series with said transistor.

According to an embodiment of the present invention, said transistor is used in switched mode for the programming and as a controllable resistor for the reading.

According to an embodiment of the present invention, a terminal of application of a positive voltage selectable between a read voltage and at least one programming voltage is provided.

The present invention also provides a one-time memory comprising:

a plurality of memory cells, each comprising a first transistor in series with a resistor in polysilicon, constituting the storage element, the programming being non destructive for the polysilicon resistor; and at least one read differential amplifier, a first input of which is connected between at least one of the cells and a second transistor, and a second input of which receives a reference potential intermediate between the programmed and non-programmed states of the cells.

According to an embodiment of the present invention, the reference potential is taken at the intermediate point of a resistive dividing bridge.

According to an embodiment of the present invention, each cell presents a non programmed state which is, by programming, modified by decreasing, in an irreversible and stable way, in the range of the read operating currents of the cell, the value of its polysilicon resistor.

According to an embodiment of the present invention, programming a cell is controlled by imposing the circulation of a current in its polysilicon resistor that is higher than the current for which the value of this resistor presents a maximum.

According to an embodiment of the present invention, a read resistive element is connected in parallel with the second transistor.

According to an embodiment of the present invention, said resistive element can be short-circuited by said second transistor during a programming of the memory cells.

According to an embodiment of the present invention, a plurality of read amplifiers receives different reference voltages and is connected by their first input to a plurality of cells, so as to constitute a multilevel memory differentiated by the value of the polysilicon resistors.

The present invention also provides a one-time programmable memory comprising:

a network of memory cells, each comprising a first transistor in series with a polysilicon resistor constituting the storage element, the programming being non destructive for the polysilicon resistor; and at least one read differential amplifier, said first transistors of the cell being interconnected in a first direction of the network to the junction points of series connection of one resistive element and one second transistor between a read supply voltage terminal and the first input of the read amplifier, the gates of the first transistors being interconnected in the second direction to outputs of a row decoder.

According to an embodiment of the present invention, a second input of the differential amplifier receives an intermediate reference potential with respect to the programmed and non-programmed states of the cells.

According to an embodiment of the present invention, the reference potential is taken at an intermediate point of a resistive dividing bridge.

According to an embodiment of the present invention, said first input of the amplifier is connected, via a programming selection switch, to a terminal of application of a programming voltage.

According to an embodiment of the present invention, said resistive elements are formed of depleted transistors.

According to an embodiment of the present invention, said read voltage terminal can be switched for disconnecting, during programming, the corresponding extremities of the interconnections in the first direction.

The invention also provides a method for programming the memory cell comprising temporarily imposing, in the polysilicon resistor, the flowing of a current greater than a current for which the value of this resistance exhibits a maximum.

According to an embodiment of the present invention, the method comprises the following steps:

increasing step by step the current in the polysilicon resistor; and measuring, after each application of a greater current, the value of this resistor in its functional read environment.

According to an embodiment of the present invention, a predetermined table of correspondence between the programming current and the desired final resistance to apply to the polysilicon resistor the adapted programming current.

According to an embodiment of the present invention, the method comprising:

in a first step, using said table of correspondence to program the resistor in a value close to the desired final resistance; and in a second step, increasing step by step the current through the polysilicon resistor until the desired final resistance is obtained.

BRIEF DESCRIPTION OF THE DRAWINGS

The foregoing objects, features and advantages of the present invention, will be discussed in detail in the following non-limiting description of specific embodiments in connection with the accompanying drawings, in which.

Figure 1:
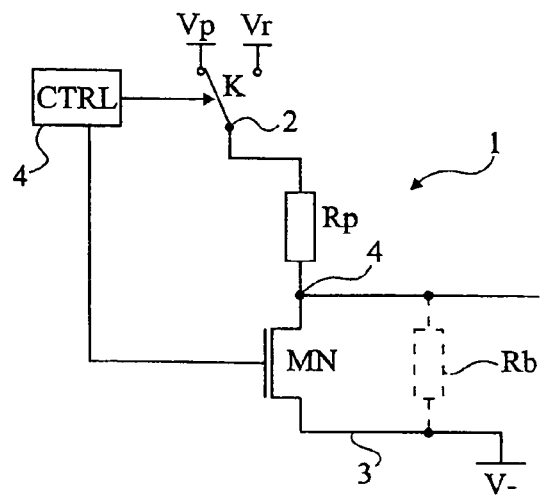
FIG. 1 shows a first embodiment of a one-time programming memory cell according to the present invention.

The same elements have been designated with the same references in the different drawings. For clarity, only those elements that are necessary to the understanding of the present invention have been shown in the drawings and will be described hereafter. In particular, the circuits exploiting the binary codes by means of the cells according to the present invention have not been described in detail. The present invention can be implemented whatever the use made of the stored code.

FIG. 1 shows a first embodiment of a one-time programming memory cell according to the present invention.

According to the present invention, memory cell 1 comprises, in series with a first terminal 2 of application of a positive supply voltage and a second terminal 3 of application of a more negative or reference supply voltage $V^-$ (generally, the ground), a programmable resistor Rp characteristic of the present invention, and a programming switch (here, an N-channel MOS transistor MN). Resistor Rp forms the storage element of cell 1. The state stored in the cell is read from junction point 4 of resistor Rp with transistor MN. The reading of the stored level is performed as will be seen hereafter in relation with FIG. 5, by comparison with a reference level.

DETAILED DESCRIPTION

A feature of the present invention is that resistor Rp forming the storage element is a polysilicon resistor having a value programmable by irreversible decrease in its value, as will be discussed hereafter in relation with FIGS. 3 and 4.

According to this embodiment, to enable reading of the state stored in cell 1, a resistor Rb (shown in dotted lines in FIG. 1) is provided, which, when transistor MN is off, forms with resistor Rp a voltage-dividing bridge. Resistor Rb has been shown in dotted lines to illustrate its optionality. Indeed, it may be formed by transistor MN then biased in a linear portion of its characteristic and not in saturation.

Transistor MN, when on, short-circuits (at least functionally) fixed resistor Rb and is used to program resistor Rp by imposing the flowing of a current therethrough. The programming current of resistor Rp is greater than the current for which this resistance exhibits a maximum value. This feature of the present invention will better appear from the description which will be made hereafter in relation with FIGS. 3 and 4. For the moment, it should only be noted that if resistor Rp is submitted to a current greater than the current for which its value is maximum, an irreversible decrease in the value of its resistance occurs when returning to currents included within the nominal operating range. The nominal range of the operating currents of a polysilicon resistor used according to the present invention is smaller than some hundred microamperes and, most often, smaller than some ten microamperes. The amplitude of the programming currents is on the order of one milliampere.

The programming of a cell such as illustrated in FIG. 1 is made possible by providing selection of the positive supply voltage applied to terminal 2 between a read voltage Vr (adapted to generating a current on the order of one microampere) and a programming voltage Vp (adapted to generating a current on the order of one milliampere). The selection is performed by means of a switch K controlled by a control circuit 4 (CTRL) further providing the control signal adapted to transistor MN.

Figure 2:
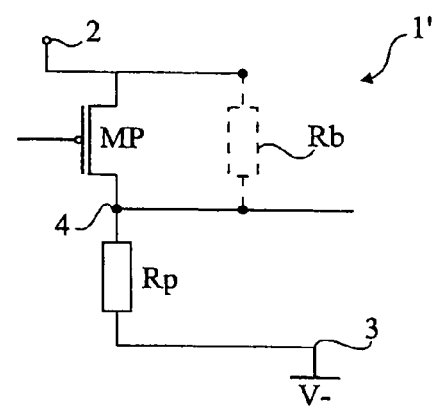
FIG. 2 shows a second embodiment of a one-time programming memory cell according to the present invention.

FIG. 2 shows a second embodiment of a memory cell 1' according to the present invention. This cell differs from the cell of FIG. 1 in that the programming transistor used is a P-channel MOS transistor MP. The P-channel MOS transistor is connected between terminal 2 and read point 4. Programming resistor Rp is connected between point 4 and terminal 3 of application of the reference voltage. In FIG. 2, switch K and control circuit 4, although still present, have not been shown. Resistor Rb in dotted lines has been symbolized in parallel on transistor MP.

The operation of a cell 1' such as shown in FIG. 2 is similar to that of cell 1 of FIG. 1. The latter however forms a preferred embodiment due to the smaller bulk of the N-channel MOS transistor with respect to the P-channel MOS transistor.

Figure 3:
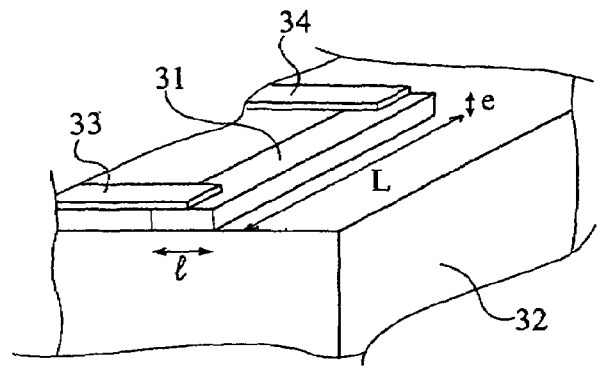
FIG. 3 illustrates in a partial perspective view an embodiment of a polysilicon resistor forming the storage element of a cell according to the present invention.

FIG. 3 shows an embodiment of a polysilicon resistor forming a storage element Rp of a cell characteristic of the present invention.

Such a resistor (designated as 31 in FIG. 3) is formed of a polysilicon track (also called a bar) obtained by etching of a layer deposited on an insulating substrate 32. Substrate 32 is indifferently directly formed of the integrated circuit substrate or is formed of an insulating layer forming an insulating substrate or the like for resistor 31. Resistor 31 is connected, by its two ends, to conductive tracks (for example, metal tracks) 33 and 34 intended to connect the resistive bar to the other integrated circuit elements. The simplified representation of FIG. 3 makes no reference to the different insulating and conductive layers generally forming the integrated circuit. To simplify, only resistive bar 31 laid on insulating substrate 32 and in contact, by the ends of its upper surface, with the two metal tracks 33 and 34, has been shown. In practice, the connections of resistive element 31 to the other integrated circuit components are obtained by wider polysilicon tracks starting from the ends of bar 31, in the alignment thereof. In other words, resistive element 31 is generally formed by making a section of a polysilicon track narrower than the rest of the track.

Resistance R of element 31 is given by the following formula:

$$R=\rho(L/s),$$

where $\rho$ designates the resistivity of the material (polysilicon, possibly doped) forming the track in which element 31 is etched, where L designates the length of element 31, and where s designates its section, that is, its width 1 by its thickness e. Resistivity $\rho$ of element 31 depends, among others, on the possible doping of the polysilicon forming it.

Most often, upon forming of an integrated circuit, the resistors are provided by referring to a notion of so-called square resistance $R_\square$. This square resistance defines as being the resistivity of the material divided by the thickness with which it is deposited. Taking the above relation giving the resistance of an element 31, the resistance is thus given by the following relation:

$$R=R_\square *L/1.$$

Quotient L/1 corresponds to what is called the number of squares forming resistive element 31. This represents, as seen from above, the number of squares of given dimension depending on the technology, put side by side to form element 31.

The value of the polysilicon resistor is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

A feature of the present invention is to temporarily impose, in a polysilicon resistor (Rp) of which the value is desired to be irreversibly decreased, a programming or constraint current greater than a current for which the resistor reaches a maximum value, this current being beyond the normal operating current range (in read mode) of this resistor. In other words, the resistivity of the polysilicon is decreased in the operating current range, in a stable and irreversible manner, by temporarily imposing in the corresponding resistive element the flowing of a current beyond the operating current range.

Another feature of the present invention is that the current used to decrease the resistance is, conversely to a fusible element, non-destructive for the polysilicon element.

Figure 4:
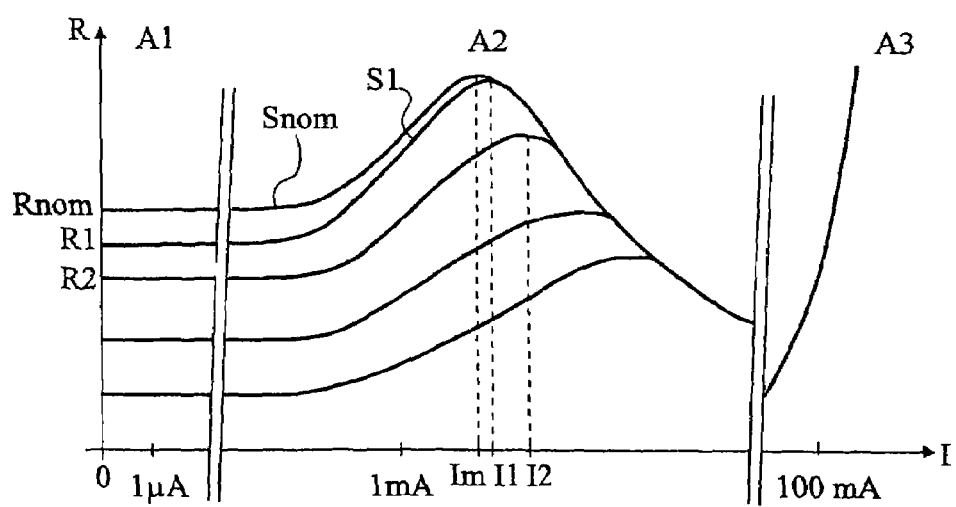
FIG. 4 illustrates, in a curve network, the programming of a memory cell according to the present invention.

FIG. 4 illustrates, with a curve network giving the resistance of a polysilicon element of the type of that shown in FIG. 3 according to the current flowing therethrough, an embodiment of the present invention for programming the memory cell resistance.

It is assumed that the polysilicon having been used to manufacture resistive element 31 (Rp) exhibits a nominal resistivity giving element 31, for the given dimensions 1, L, and e, a resistance $R_{nom}$. This nominal (original) value of the resistance corresponds to the value taken in a stable manner by resistive element 31 in the operating current range of the system, that is, generally, for currents smaller than 100 µA.

According to the present invention, to decrease the resistance and to switch in an irreversible and stable manner, for example, to a value R1 smaller than $R_{nom}$, a so-called constraint current (for example, I1), greater than a current Im for which the value of resistance R of element 31 is maximum without for all this being infinite, is imposed across resistive element 31. As illustrated in FIG. 4, once current I1 has been applied to resistive element 31, a stable resistance of value R1 is obtained in range A1 of operating currents of the integrated circuit. In fact, curve $S_{nom}$ of the resistance according to the current is stable for relatively low currents (smaller than 100 µA). This curve starts increasing for substantially higher currents on the order of a few milliamperes, or even more (range A2). In this current range, curve $S_{nom}$ crosses a maximum for value Im. The resistance then progressively decreases. In FIG. 4, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the resistance or more specifically the resistivity of the polysilicon element.

Indeed, once the maximum of curve $S_{nom}$ of the resistivity according to the current has been passed, the value taken by the resistance in the operating current range is smaller than value $R_{nom}$. The new value, for example, R1, depends on the higher value of the current (here, I1) which has been applied during the irreversible current phase. It should indeed be noted that the irreversible decrease performed by the present invention occurs in a specific programming phase, outside of the normal read operating mode (range A1) of the integrated circuit, that is, outside of the normal operation of the resistor.

If necessary, once the value of the polysilicon resistor has been lowered to a lower value (for example, R1 in FIG. 4), an irreversible decrease in this value may further be implemented. It is enough, to achieve this, to exceed maximum current I1 of the new curve S1 of the resistance according to the current. For example, the value of the current may be increased to reach a value I2. When the current is then decreased again, a value R2 is obtained for the resistor in its normal operating range. The value of R2 is smaller than value R1 and, of course, than value $R_{nom}$. In the application to the memory cells of FIGS. 1 and 2, this shows the irreversible character of the implemented programming. An overprogramming attempt only enhances the decrease in the resistance value with respect to its nominal value, and thus only confirms the initial programming.

It can be seen that all the curves of the resistance according to the current join on the decrease slope of the resistance value, after having crossed the maximum of the curve. Thus, for a given resistive element (ρ, L, s), currents I1, I2, etc. which must be reached, to switch to a smaller resistance value, are independent from the value of the resistance ($R_{nom}$, R1, R2) from which the decrease is caused. In fact, the current causes an increase in the temperature of the polysilicon element, which causes its flow.

What has been expressed hereabove as the resistance value actually corresponds to a decrease in the resistivity of the polysilicon forming the resistive element. The present inventors consider that the crystalline structure of the polysilicon is modified in a stable manner and that, in a way, the material is reflowed, the final crystalline structure obtained depending on the maximum current reached.

Of course, it will be ascertained not to exceed programming current range A2 (on the order of a few milliamperes) to avoid destroying the polysilicon resistor. This precaution will pose no problem in practice since the use of polysilicon to form a fuse requires much higher currents (on the order of one tenth of an ampere) which are not available once the circuit has been made.

The practical forming of a polysilicon resistor according to the present invention does not differ from the forming of a conventional resistor. Starting from an insulating substrate, a polysilicon layer is deposited and etched according to the dimensions desired for the resistor. Since the deposited polysilicon thickness is generally determined by the technology, the two dimensions which can be adjusted are the width and the length. Generally, an insulator is redeposited on the polysilicon bar thus obtained. In the case of an on-line interconnection, width 1 will have been modified with respect to the wider access tracks to be more strongly conductive. In the case of an access to the ends of the bar from the top as shown in FIG. 3, vias will be made in the overlying insulator (not shown) of the polysilicon bar to connect contact metal tracks 33 and 34.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible doping of the polysilicon, whatever its type, does not hinder the implementation of the present invention. The only difference linked to the doping is the nominal resistivity before constraint and the resistivities obtained for given constraint currents. In other words, for an element of given dimensions, this conditions the starting point of the resistance value, and accordingly the resistance values obtained for given constraint currents.

To switch from the nominal value to a lower resistance or resistivity value, several methods may be used according to the present invention.

According to a first embodiment, the current is progressively (step by step) increased in the resistor. After each application of a higher current, it is returned to the operating current range and the resistance value is measured. As long as current point Im has not been reached, this resistance value will remain at value $R_{nom}$. As soon as current point Im has been exceeded, there is a curve change (curve S) and the measured value when back to the operating currents becomes a value smaller than value $R_{nom}$. If this new value is satisfactory, the process ends here. If not, higher currents are reapplied to exceed the new maximum value of the current curve. In this case, it is not necessary to start from the minimum currents again as when starting from the nominal resistance. Indeed, the value of the current for which the resistance will decrease again is necessarily greater than the value of constraint current I1 applied to pass onto the current curve. The determination of the pitch to be applied is within the abilities of those skilled in the art and is not critical in that it essentially conditions the number of possible decreases. The higher the pitch, the more the jumps between values will be high.

According to a second embodiment, the different currents to be applied to pass from the different resistance values to smaller values are predetermined, for example, by measurements. This predetermination takes of course into account the nature of the polysilicon used as well as, preferentially, the square resistance, that is, the resistivity of the material and the thickness with which it is deposited. Indeed, since the curves illustrated by FIG. 4 may also be read as the curves of the square resistance, the calculated values can be transposed to the different resistors of an integrated circuit defined by widths and the lengths of the resistive sections. According to this second embodiment, the value of the constraint current to be applied to the resistive element to decrease its value in an irreversible and stable manner can then be predetermined.

The two above embodiments may be combined. An approximate value may thus, in a first step, be selected (from a table) and the corresponding predetermined current may be applied. Then, in a second step, the resistance value is refined by step-by-step decreases in its value.

According to the present invention, the irreversible decrease in the resistance or resistivity can be performed after manufacturing when the circuit is in its functional environment. In other words, control circuit 4 and the programming transistors described in relation with FIGS. 1 and 2 can be integrated with the memory cell(s).

The curve change, that is, the decrease in the resistance value in normal operation is almost immediate as soon as the corresponding constraint current is applied. "Almost immediate" means a duration of a few tens or even hundreds of microseconds which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, any additional duration of application of the constraint current does not modify, at least at the first order, the obtained resistance. Moreover, even if in a specific application, it is considered that the influence of the duration of application of the constraint cannot be neglected, the two preferred embodiments (predetermining constraint values in duration and intensity, or step-by-step progression to the desired value) are perfectly compatible with the taking into account of the duration of application of the constraint.

As a specific example of embodiment, an $N^+$ doped polysilicon resistor having a cross-section of 0.225 square micrometer (l=0.9 μm, e=0.25 μm) and a length L of 45 micrometers has been formed. With the polysilicon used and the corresponding doping, the nominal resistance was approximately 6300 ohms. This corresponds to a resistance per square of approximately 126 ohms (50 squares). By applying to this resistor a current greater than three milliamperes, a decrease in its value, stable for an operation under currents reaching 500 microamperes has been caused. With a current of 3.1 milliamperes, the resistance has been lowered to approximately 4500 ohms. By applying to the resistor a current of 4 milliamperes, the resistance has been decreased down to approximately 3000 ohms. The obtained resistances have been the same for constraint durations ranging from 100 microseconds to more than 100 seconds.

According to a particular implementation of the invention, the constraint current is comprised between 1 and 10 mA.

Always according to a particular implementation, the dopant concentration in the polycrystalline silicon is comprised between $1\times10^{13}$ and $1\times10^{16}$ atoms/cm$^3$.

For example, polycrystalline silicon resistors have been made with the following nominal characteristics.

| | Polycrystalline | Crystalline | Crystalline | Amorphous |
|---|---|---|---|---|
| Technology | 0.18 µm | 0.18 µm | | 0.35 µm |
| Width | 0.5 µm | 0.5 µm | | 0.9 µm |
| Length | 3.4 µm | 80 µm | | 45 µm |
| Thickness | 200 nm | 200 nm | | 250 nm |
| Resistance/square | 80 ohms/□ | 100 ohms/□ | | 115 ohms/□ |
| Global resistance | 556 ohms | 16.000 ohms | | 5.750 ohms |
| Dopant concentration (atoms/cm$^3$) | As = $6 \times 10^{15}$ | As = $5 \times 10^{15}$ | | P = $1 \times 10^{13}$ As = $4 \times 10^{15}$ |
| Constraint current for reducing by one half the resistor | 5.5 mA | 4.8 mA | | 2.75 mA |

Of course, the above examples as well as the given orders of magnitude of currents and resistances for the different ranges concern present technologies. The currents of ranges A1, A2, and A3 may be different (smaller) for more advanced technologies and may be transposed to current densities. The principle of the present invention is not modified by this. There are still three ranges and the intermediary range is used to force the resistivity decrease.

Programming voltage Vp may be a variable voltage according to whether the programming current levels are predetermined or are unknown and must be obtained by a step-by-step increase.

According to an alternative embodiment, the programming current forced in resistor Rp is set by the control (gate voltage) of the corresponding programming transistor, voltage Vp being then fixed.

An advantage of the present invention is that a memory cell formed by means of a polysilicon resistor programmable by irreversible decrease in its value is compatible with conventional MOS transistor manufacturing technologies. In particular, no floating gate transistor is necessary, nor any tunnel structure like for the forming of an EPROM memory.

Another advantage of the present invention is that the code stored in the storage element is not optically detectable, conversely to a polysilicon resistor which would be used as a fuse where the physical damage on the silicon bar makes the programming visible.

Another advantage of the present invention is that the irreversible modification of the value of the programmed resistor is not destructive and thus does not risk damaging other circuit parts. This especially enables providing a decrease in the value of the resistance after manufacturing, and even during its lifetime in its application circuit.

Figure 5:
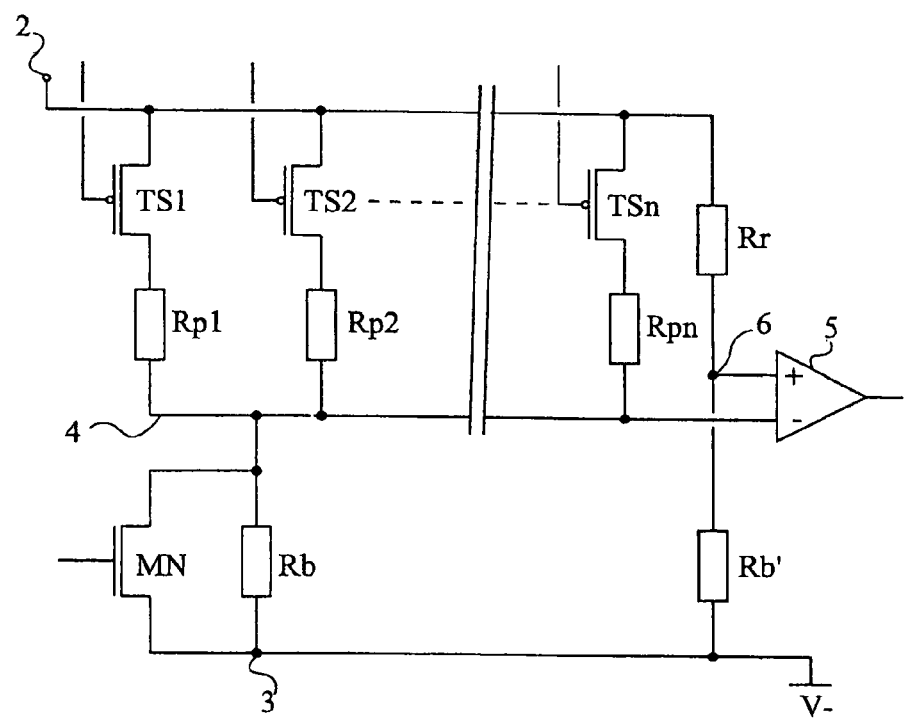
FIG. 5 shows a first embodiment of a multiple-cell memory according to the present invention.

FIG. 5 shows the electric diagram of a memory according to an embodiment of the present invention, associating several cells of the type of that shown in FIG. 1.

According to this embodiment, n storage elements Rp1, Rp2, . . . Rpn are provided. All the programming resistors Rpi are individually connected by a selection transistor TS1, TS2, TSn to terminal 2 of application of a positive voltage. Transistors TSi are, in this example, P-channel MOS transistors and individually receive a control signal selecting the considered memory bit. The terminals of the resistors Rpi opposite to the respective transistors TSi are connected together to point 4 connected, by a single programming transistor MN, to reference voltage 2. A read resistor Rb is connected in parallel on transistor MN. Node 4 is connected to one of two inputs (for example, the inverting input) of a differential amplifier 5 forming a sense amplifier of the memory and outputting the state of the selected cell. The other input, (for example, non-inverting) of differential amplifier 5 is connected to the junction point 6 of a reference resistor Rr and of a second read resistor Rb' connected in series between two terminals 2 and 3.

Resistors Rb and Rb' have same values. The value of resistor Rr is chosen to range between the value of the resistors programmed at state 0 (respectively 1) of the memory cells and the value of the unprogrammed resistors providing a state 1 (respectively 0). Thus, since resistors Rb and Rb' have identical values, the output of differential amplifier 5 is different according to whether the selected resistor Rpi has had its value irreversibly decreased by programming according to the present invention. Initially, since resistors Rp all have a value greater than the value of reference resistor Rr, the initial code is, in the example of FIG. 5, a sequence of high states, for a non-inverting (comparator) amplifier.

An advantage of the present invention is that the individual cell is compatible with a serialization of different cells, as illustrated in FIG. 5, or with a putting in parallel of the cells by providing one programming transistor for each cell.

Another advantage of the present invention is that the number of read cycles is not limited.

Another advantage of the present invention is that it requires no specific technology, conversely to one-time programming memory structures of EPROM or EEPROM type.

Another advantage of the present invention is that it is not sensitive to ultraviolet rays and thus cannot be erased by this means. More generally, a memory cell programmed according to the present invention is unerasable due to the irreversible resistance decrease performed.

According to an alternative embodiment, one or several comparators (amplifiers 5), each associated with different reference dividing bridges, may be added. A multiple-level memory is then obtained, the stored level depending on the value (for example, I1 or I2) of the programming current applied to the resistor Rpi of each branch. Several programming voltages Vp are then provided (at least functionally, for example, by means of resistive dividers).

Several memory cells according to the present invention may also be associated in an array of cells to form a one-time programming memory.

Figure 6:
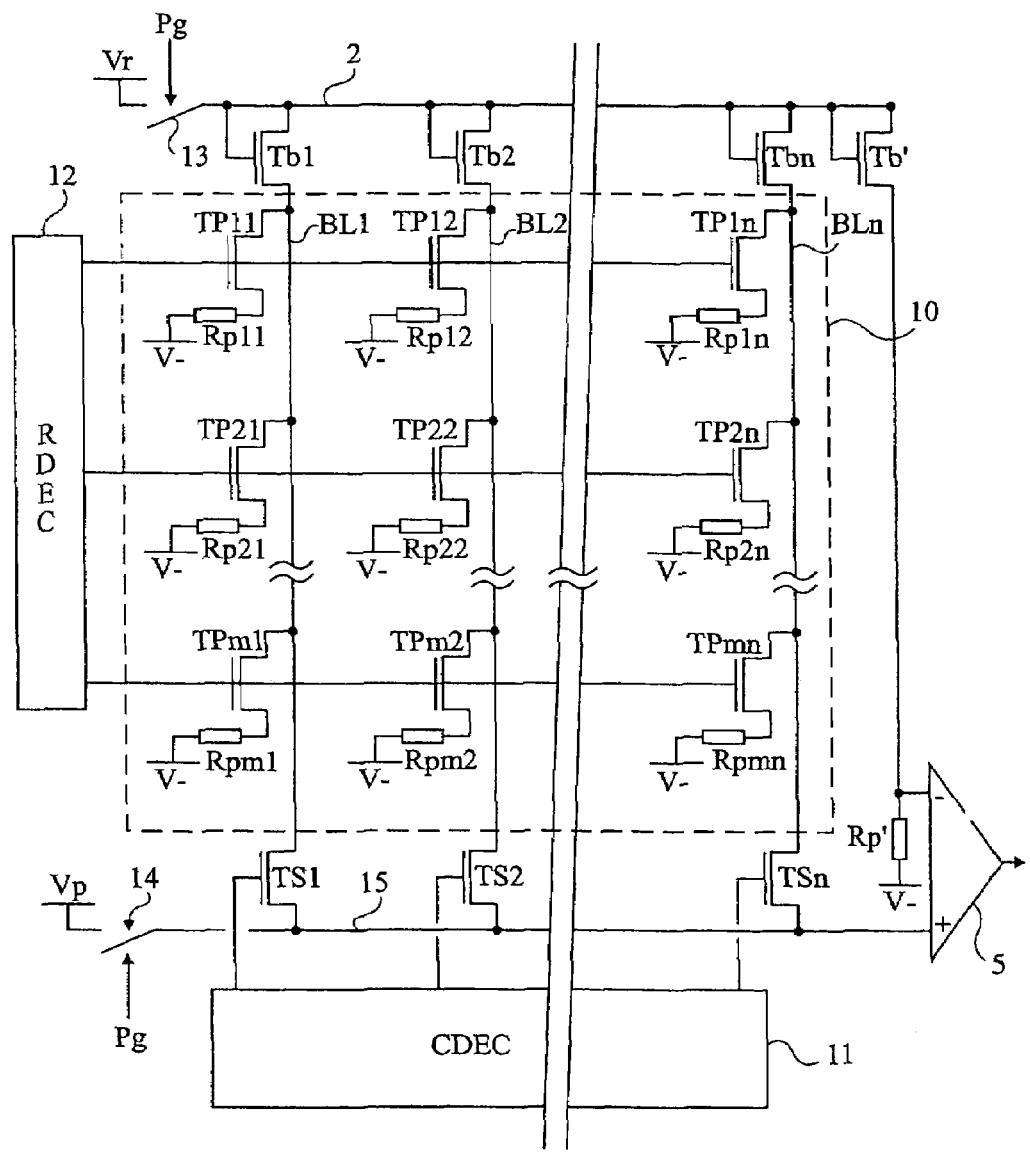
FIG. 6 shows a second embodiment of a memory according to the present invention.

FIG. 6 shows a second embodiment of a one-time programming memory according to the present invention illustrating such an array network.

A network 10 of n columns and m lines of memory cells is considered. Each memory cell comprises, in series between a bit line BL1, BL2, . . . BLn and negative reference voltage V— (the ground), an N-channel programming transistor TP and a polysilicon programming resistor Rp. In FIG. 6, programming transistors TP and resistors Rp have been referred to with the number of the line and column to which they respectively belong.

Each bit line BL is connected to terminal 2 of application of a supply voltage Vr via an N-channel transistor Tb1, Tb2 . . . Tbn behaving as the charge resistor Rb of the previous embodiments. In practice, these are depleted transistors. Each bit line is connected, by its other end and via a selection transistor, respectively, Ts1, Ts2, . . . Tsn, to an input (for example, non-inverting) of a differential sense amplifier 5, the output of which provides the state of the read cell. The other (inverting) input of amplifier 5 is connected to the midpoint of a voltage-dividing bride formed of the series association of an N-channel MOS transistor Tb' connected to supply voltage Vr and of a resistor Rp' connected to reference voltage V−.

The respective gates of selection transistors Ts are connected to individual outputs of a column-decoding circuit 11 (CDEC) while the gates of the programming transistors of network 10 are interconnected, for each line, to outputs of a row decoder 12 (RDEC). The decoders of rows 12 and of columns 11 have the function, as in a conventional memory network, of selecting one of the memory cells, the state of which is desired to be read or written.

Preferably, resistor Rp' is an also programmable polysilicon resistor and exhibits the same nominal value after manufacturing as all the resistors in the array network. Similarly, the charge resistors formed by transistors Tb and Tb' are all identical. Upon programming of the memory cell network, reference resistor Rp' is first programmed to a value that may be chosen to be greater than the value of the network resistors when they are programmed in the state different from their original state. As an alternative, resistor Rp' is set by sizing to such an intermediary value. However, an advantage of using a programming of this resistor is that this ensures, whatever the possible manufacturing dispersions, a correct parameterizing of the memory.

For the programming, the supply voltage is selected to be a programming voltage greater than read voltage Vr in the embodiment shown in FIG. 6. In programming, switch 13 bringing the read supply on line 2 is turned off and switch 14 bringing the programming voltage on line 15 of interconnection of selection transistors TS is turned on. The cells, resistance Rp of which is desired to be decreased, are then successively selected by means of the line and column decoder. The selected resistors are applied the programming voltage via the selection transistor and programming transistor TP which are then in series. If desired, the non-inverting input of amplifier 5 is associated with a protection means, especially for the case where the programming voltage is greater than read voltage Vr. Indeed, it should be noted that the embodiment of FIG. 6 is compatible with the use of a same voltage for the programming and the reading. This voltage is then chosen at a sufficient level to impose the programming. In read mode, an additional resistor linked to transistor Tb is added between the read voltage and the programming transistor then used as a selection transistor. Transistors Tb are then sized to introduce a series resistance much higher than that of the selection transistors, to impose a sufficient voltage drop to avoid programming when the supply voltage is applied on line 2 while a reading is desired to be performed.

As an alternative, programming selection transistors short-circuit transistors Tb in a programming may be provided, voltage Vp being then applied to terminal 2 and no longer to transistors Ts which are then only interconnected on the non-inverting input of amplifier 5.

The generation of programming control signals Pg of switches 13 and 14, as well as of the signals for selecting the different cells, is within the abilities of those skilled in the art based on the functional indications given hereabove.

Another example of application of the present invention relates to the locking of an integrated circuit after detection of a fraud attempt. Fraud attempt detection processes are perfectly well known. They are used to identify that an integrated circuit chip (for example, of prepaid or not smart card type) has been attacked for, either using the prepaid units, or discovering a secret key of the chip. In such a case, the subsequent chip operation is desired to be invalidated to avoid for the fraud to be successful. By the implementation of the present invention, it is possible to store a secret quantity by means of a one-time programming memory specific to the present invention. If, during the integrated circuit lifetime, a fraud attempt justifying the chip disabling is detected, the programming of one or several memory cells in an inverse state is automatically caused. By inverting even a single bit of the secret quantity, the system will no longer be able to identify the chip properly, which results in a full and irreversible locking of the chip.

To program a memory according to the present invention, several distinct phases in the product lifetime may be dissociated. For example, a first area (first series of resistors) programmable at the end of the manufacturing to contain a "manufacturer" code is provided. The rest of the memory is left available to be programmed (in one or several goes) by the user (final or not).

Of course, the present invention is likely to have various alterations, modifications, and improvement which will readily occur to those skilled in the art. In particular, the transposing of a series assembly such as illustrated in FIG. 5 to a parallel assembly is within the abilities of those skilled in the art based on the functional indications given hereabove. Further, the dimensions given to the resistors forming the storage elements and to the different current and voltage sources necessary for the programming are within the abilities of those skilled in the art based on the functional indications indicated in the present description. Finally, it should be noted that the present invention can easily be transposed from one technology to another.

What is claimed is:

1. A one-time programmable memory cell, comprising a transistor in series with a polysilicon resistor forming a storage element, wherein the programming is controlled by forcing current to flow in the polysilicon resistor which is greater than the current for which the value of the polysilicon resistor is maximum, the programming being non-destructive for the polysilicon resistor.

2. The memory cell of claim 1, wherein an unprogrammed state is, by programming, modified by decreasing in an irreversible and stable manner, in the read operating current range of the cell, the value of the programming polysilicon resistor.

3. The memory cell of claim 1, wherein a resistive read element is connected in parallel with said transistor.

4. The memory cell of claim 1, wherein a resistive read element is connected in series with said transistor.

5. The memory cell of claim 1, wherein said transistor is used in switched mode for programming and as a controllable resistor for reading.

6. The memory cell of claim 1, comprising a terminal of application of a positive voltage selectable between a read voltage and at least one programming voltage.

7. A method for programming the memory cell of claim 1, comprising temporarily imposing, in the polysilicon resistor, the flowing of a current greater than a current for which the value of a resistance exhibits a maximum.

8. The method of claim 7, comprising the steps of:
increasing step by step the current in the polysilicon resistor; and
measuring, after each application of a greater current, the value of said polysilicon resistor in its functional read environment.

9. The method of claim 7, comprising using a predetermined table of correspondence between the programming current and the desired final resistance to apply to the polysilicon resistor the adapted programming current.

10. The method of claim 9, comprising:
in a first step, using said table of correspondence to program the resistor in a value close to the desired final resistance; and
in a second step, increasing step by step the current through the polysilicon resistor until the desired final resistance is obtained.

11. A one-time memory, comprising:
a plurality of memory cells, each comprising a first transistor in series with a polysilicon resistor, constituting a storage element, the programming being non destructive for the polysilicon resistor; and
at least one read differential amplifier, a first input of which is connected between at least one of the cells and a second transistor, and a second input of which receives a reference potential intermediate between the programmed and non programmed states of the cells.

12. The memory of claim 11, wherein the reference potential is taken at an intermediate point of a resistive dividing bridge.

13. The memory of claim 11, wherein each cell presents a non programmed state which is, by programming, modified by decreasing, in an irreversible and stable way in the range of the read operating currents of the cell, the value of its polysilicon resistor.

14. The memory of claim 11, wherein the programming of a cell is controlled by imposing the circulation of a current in its polysilicon resistor that is higher than the current for which the value of this resistor presents a maximum.

15. The memory of claim 11, wherein a read resistive element is connected in parallel with the second transistor.

16. The memory of claim 15, wherein said resistive element can be short-circuited by said second transistor during a programming of the memory cells.

17. The memory of claim 11, wherein a plurality of read amplifiers receives different reference voltages and are connected by their first input to a plurality of cells, so as to constitute a multilevel memory differentiated by the value of the polysilicon resistors.

18. A one-time programmable memory, comprising:
a network of memory cells, each comprising a first transistor in series with a polysilicon resistor constituting the storage element, the programming being non destructive for the polysilicon resistor; and
at least one read differential amplifier, said first transistors of the cell being interconnected in a first direction of the network to the junction points of a series connection of one resistive element and one second transistor between a read supply voltage terminal and the first input of the read amplifier, the gates of the first transistors being interconnected in the second direction to outputs of a row decoder.

19. The memory of claim 18, wherein a second input of the differential amplifier receives an intermediate reference potential with respect to the programmed and non programmed states of the cells.

20. The memory of claim 19, wherein the reference potential is taken at an intermediate point of a resistive dividing bridge.

21. The memory of claim 18, wherein said first input of the amplifier is connected, via a programming selection switch, to a terminal of application of a programming voltage.

22. The memory of claim 18, wherein said resistive elements are formed of depleted transistors.

23. The memory of claim 18, wherein said read voltage terminal can be switched for disconnecting, during a programming, the corresponding extremities of the interconnections in the first direction.

* * * * *

UNITED STATES PATENT AND TRADEMARK OFFICE
CERTIFICATE OF CORRECTION

PATENT NO. : 7,110,277 B2  
APPLICATION NO. : 10/504273  
DATED : September 19, 2006  
INVENTOR(S) : Luc Wuidart et al.

Page 1 of 1

It is certified that error appears in the above-identified patent and that said Letters Patent is hereby corrected as shown below:

Column 12, line 45 should read:  
forcing a current to flow in the polysilicon resistor which is greater Signed and Sealed this Third Day of July, 2007

JON W. DUDAS  
*Director of the United States Patent and Trademark Office*